United States Patent [19]
Neuberger et al.

[11] Patent Number: 6,005,717
[45] Date of Patent: Dec. 21, 1999

[54] DIODE LASER BEAM COMBINER SYSTEM

[75] Inventors: Wolfgang Neuberger, F. T. Labaun, Malaysia; Michael Quade, Palmer, Mass.

[73] Assignee: CeramOptec Industries, Inc., East Longmeadow, Mass.

[21] Appl. No.: 09/193,742

[22] Filed: Nov. 17, 1998

[51] Int. Cl.[6] .......................... G02B 27/10; G02B 27/30; G02B 3/02
[52] U.S. Cl. .......................... 359/619; 359/618; 359/621; 359/641; 359/719
[58] Field of Search .................................. 359/619, 618, 359/719, 621, 900, 641

[56] References Cited

U.S. PATENT DOCUMENTS

| | | | |
|---|---|---|---|
| 5,442,487 | 8/1995 | Mizuno | 359/784 |
| 5,521,748 | 5/1996 | Sarraf | 359/321 |
| 5,568,318 | 10/1996 | Leger et al. | 359/618 |
| 5,625,402 | 4/1997 | Sarraf | 347/232 |
| 5,668,903 | 9/1997 | Neuberger et al. | 385/38 |
| 5,751,871 | 5/1998 | Krivoshlykov et al. | 385/33 |
| 5,761,234 | 6/1998 | Craig et al. | 372/75 |

*Primary Examiner*—Georgia Epps
*Assistant Examiner*—Saeed Seyrafi
*Attorney, Agent, or Firm*—Bolesh J. Skutnik; B J Associates

[57] ABSTRACT

A small, scalable, and inexpensive semiconductor diode laser system is described that includes a diode laser beam combiner comprising a cylindrical microlens, a lens array, and a fan window that optically combines energy outputs of at least two diode laser emitters or emitter groups. The diode laser beam combiner first collimates the diode laser energy and then optically combines the energy along a predetermined axis, thus limiting effects due to space between the diode laser emitters. A chosen spot size and shape can be achieved by manipulating the number and size of lens array and fan window steps. Maximum power density and beam brightness available from the diode laser emitters or emitter groups is thus available at a work or treatment site.

16 Claims, 8 Drawing Sheets

DIODE LASER BEAM COMBINER SYSTEM

BACKGROUND OF THE INVENTION

1. Field of the Invention

The present invention relates to devices that yield maximum available power density and beam brightness while combining outputs of semiconductor diode lasers into a substantially rectangular shaped spot.

2. Information Disclosure Statement

Semiconductor diode lasers have distinct advantages over classical lasers including smaller size, lower power consumption, and lower maintenance costs. Employing inexpensive semiconductor laser arrays would be preferable for many industrial applications since these lasers offer simple alignment and can easily be substituted for service repair. Such diode lasers could replace conventional laser sources for welding, cutting and surface treatment, or could be used for pumping solid state lasers and optical fiber lasers or amplifiers.

The necessary power for these applications exceeds the power available from a single low-cost diode laser because both the power density on the facet and the heat generated by the diode limits the output power. Therefore, to obtain higher output power, diode laser devices usually consist of several emitters or emitter groups that are combined to form an array of emitters on one or more substrates. Higher output power is attained with this set up, but the effective width of the combined beam also increases, thus making it difficult to focus a beam to a required spot size and divergence.

Suitable optics must be employed to effectively combine highly divergent semiconductor diode laser outputs. Ideally, these optics would combine the outputs into a substantially circular or square shape, which can be focused to a small spot with low divergence to provide the maximum power density and beam brightness available at a work or treatment site. In practice, however, it is difficult to provide maximum power density and beam brightness when combining diode laser outputs.

The maximum transmittable power density and beam brightness that may be available at a work or treatment site is limited to the original beam quality. A measure of beam quality is beam propagation parameter, $M^2$, which can be calculated and analyzed to determine how well a laser beam may be focused. Generally, the highest quality beam is associated with the highest focusability to the smallest spot size, which corresponds with the highest power density. FIG. 1 shows the variables used to determine $M^2$, which is directly related to the product of a beam's minimum near-field diameter, W, and beam divergence angle, $\theta$, in the far field for a specific emission wavelength, $\lambda$:

$$M^2 = \pi W \theta / 4 \lambda \qquad (1)$$

Laser beams with $M^2=1$ are ideal, and larger $M^2$ values indicate decreasing focusability of a laser beam; $M^2$ values less than 1 are unattainable.

The near field is the region at, or very close to the output aperture of the diode laser emitter, which is characterized by disordered phase fronts, and is often called the Fresnel zone. In the near field, shape, size, profile and divergence can vary rapidly with distance along the beam path. The extent of the near field depends on the laser type and for a highly divergent source such as a diode laser, it can be as short as a few microns from the output facet. In contrast, the near field of an excimer laser might be many meters.

At longer propagation distances from the laser, the phase fronts become ordered, leading to stable beam characteristics This is known as the far field, or Fraunhofer zone. A very rough approximation of the distance to the onset of the far field region can be obtained by taking the square of the beam's minimum near field diameter, W, divided by the wavelength, $\lambda$:

$$F = W^2 / \lambda \qquad (2)$$

For example, for a typical HeNe laser having a circular output (W=1 mm, $\lambda$=632.8 nm), the distance to the far-field begins at about 1.5 m, while for a typical YAG laser having a circular output (W=10 mm, $\lambda$=1064 nm), the far field distance begins nearly 100 m from the source.

The quality of a diode laser beam is typically examined with respect to the fast axis, which is the high divergence axis, perpendicular to the pn-plane of a semiconductor diode, and with respect to the slow axis, which is the lower divergence axis, parallel to the pn-plane of a semiconductor diode. FIG. 2 shows that emitted laser beam 24 from semiconductor laser diode 21 propagates along the z-axis and diverges rapidly along the y-axis, termed the fast axis, which is along the minor axis of diode laser stripe 23. Concurrently, emitted laser beam 24 diverges slower along the x-axis, termed the slow axis, which is along the major axis of diode laser stripe 23. Near the source, emitted laser beam 24 is elliptically shaped with the x-axis being the long axis. The minimum near field diameter, W, is therefore different along the fast and slow axes. For $M^2_{slow}$ calculations, W is assumed to be the effective diameter along the major axis, or x-axis, and for $M^2_{fast}$ calculations, W is assumed to be the effective diameter along the minor axis, or y-axis. Since the effective diameter, W, is so much larger along the slow axis compared to the fast axis, $M^2_{slow}$ typically are larger than $M^2_{fast}$, indicating that beam quality is greater along the fast axis. $M^2$ for a beam is equal to the square root of the product of the $M^2$ values for both axes, i.e. $M^2 = (M^2_{fast} M^2_{slow})^{1/2}$.

As emitted laser beam 24 propagates away from the source, it diverges more rapidly along the y-axis than the x-axis. After some distance, laser beam 24 will be circular for an instant, and thereafter, the long axis of the ellipse becomes the y-axis. Generally, for many high power laser diodes, the fast axis diverges at about 40° and the slow axis diverges at about 20°.

Adding diode laser emitters to form an array leads to an $M^2$ value for the "enveloped" beam where "enveloped" is used to describe the combined beams of the diode laser emitters, and is given by:

$$M^2_{enveloped} > \Sigma M^2_n \qquad (3)$$

where n is the number of emitters. $M^2_{enveloped}$ increases as the effective width of the "enveloped" beam increases, and is greater than the sum of the $M^2$ values for the individual beams because the effective width includes the space between the emitters. It thus would be advantageous to increase beam quality by employing suitable optics to combine the beams and limit the effects of the space between the emitters. If the beams can efficiently be combined, $M^2_{enveloped}$ can be decreased, and therefore, greater power density and beam brightness is available at a work or treatment site.

The maximum power density and beam brightness available at a work or treatment site is based upon the original "enveloped" beam without any free space between the emitters. In other words, the highest quality "combined" beam ($M^2_{minimum}$) that may be obtained is equal to the sum of the $M^2$ values of the diode laser beams. This maximum beam quality is hereinafter referred to as $M^2_{min}$.

Most gas or solid state lasers emit beams with a divergence angle of about a milliradian, meaning that they spread to about one meter in diameter after traveling a kilometer. Semiconductor lasers have a much larger beam divergence and require suitable optics to reshape the beam and limit the divergence. However, according to Krivoshlykov et al. (U.S. Pat. No 5,751,871), these optics may decrease the focusability of the beam, and further limit the beam quality due to large aberrations of the system resulting from large non-paraxial angles of the laser beam rays, mode mismatches, and tight alignment tolerances. A diode laser device that could simply maintain beam quality would thus be advantageous.

If beams from multiple diode lasers can efficiently be combined, M2enveloped can be minimized within the shaping optics to $M^2_{mim}$, and laser energy can be tightly focused to maximum high power densities for welding, cutting and surface treatment. Additionally, decreasing $M^2_{enveloped}$ to $M^2_{min}$, yields maximum transmittable laser brightness for use in pumping solid state lasers and optical fiber lasers or amplifiers.

Various methods have been previously employed to combine the outputs of multiple diode laser emitters. Neuberger et al., in U.S. Pat. No. 5,688,903, describes the state of the prior art which simply comprises coupling radiation from each diode laser emitter into a single optical fiber, and the fiber is then bundled together with other similar fibers. This prior art is efficient in power through-put, but inefficient in maintaining beam quality because the free space of the optical fiber is too large compared to the laser beam, and thus the energy density dissipates as it fills the free space while propagating through the fiber. Products are now available from companies like Opto Power or CeramOptec Industries Inc. that utilize this round optical fiber coupling with diode arrays operating with different geometry and wavelengths.

Additionally, in an alternative embodiment, Neuberger et al. (U.S. Pat. No. 5,668,903) teaches the beam combining device displayed in FIG. 3. Radiation from diode laser emitters 301–304 propagates through flat surface 310 and is reflected and focused by shaped side surfaces 306–309 in the direction parallel to the axis of optical fiber 305 which collects radiation from diode laser emitters 301–304. These state of the art systems can be very complicated and expensive. Moreover, these systems still make it difficult to reach the goal of $M^2_{min}$. Thus, to effectively take advantage of the diode laser and address one or more of the above problems, there is a need for a diode based laser system that is small, scalable, inexpensive, and capable of transmission of tightly focusable radiation.

OBJECTS AND SUMMARY OF THE INVENTION

It is therefore an object of the present invention to address the need for a more efficient laser system by providing a diode laser system which is self contained and compact, and comprises a minimum of high cost materials.

Another object of the present invention is to provide a scalable, simple and inexpensive diode array laser system that is capable of combining laser outputs from at least two diode laser emitters.

A further object of the present invention is to provide an optical combining system which is capable of decreasing M2enveloped to M2min by limiting the effects of space between diode laser emitters, thus providing the maximum power density and beam brightness that is available from a multi-diode laser source.

A further aim of the present invention is to provide a diode laser system that focuses radiation to a substantially rectangular shaped spot.

Briefly stated, the present invention provides a small, scalable, and inexpensive semiconductor diode laser system that includes a diode laser beam combiner comprising a cylindrical microlens, a lens array, and a fan window that optically combines energy outputs of at least two diode laser emitters or emitter groups. The diode laser beam combiner first collimates the diode laser energy and then optically combines the energy along a pre-determined axis, thus limiting effects due to space between the diode laser emitters. A chosen spot size and shape can be achieved by manipulating the number and size of lens array and fan window steps. Maximum power density and beam brightness available from the diode laser emitters or emitter groups is thus available at a work or treatment site.

BRIEF DESCRIPTION OF THE DRAWINGS

FIG. 5 shows a magnification of a selected portion of FIG. 4a.

DETAILED DESCRIPTION OF PREFERRED EMBODIMENTS

Semiconductor diode lasers emit beams with large divergence and therefore, optics must be employed to focus the radiation. However, these optics, and the optical delivery fiber itself, can decrease the focusability of the beam and limit the beam quality due to large aberrations of the system resulting from large non-paraxial angles of the laser beam rays, mode mismatches, and tight alignment tolerances. It thus would be advantageous to maintain or improve "enveloped" beam quality, $M^2_{envelope}$, to a minimum value, $M^2_{min}$, during optical beam combining, thereby providing the maximum available power density and beam brightness at a work or treatment site.

To obtain higher output power, diode laser devices usually consist of several emitters or emitter groups, which are combined to form an array of emitters on one or more substrates. The present invention provides a system that efficiently combines semiconductor laser outputs to limit disadvantageous effects of space between the diode laser emitters, thereby maximizing the power density and beam brightness available at a work or treatment site. The system includes a) a semiconductor diode laser array (array), b) a cylindrical microlens (microlens), c) a special lens array (lens array), d) a beam combiner (fan window), and e) a focussing lens (lens). These optical components may be combined in different variations without going beyond the scope of the present invention.

Figure 1:
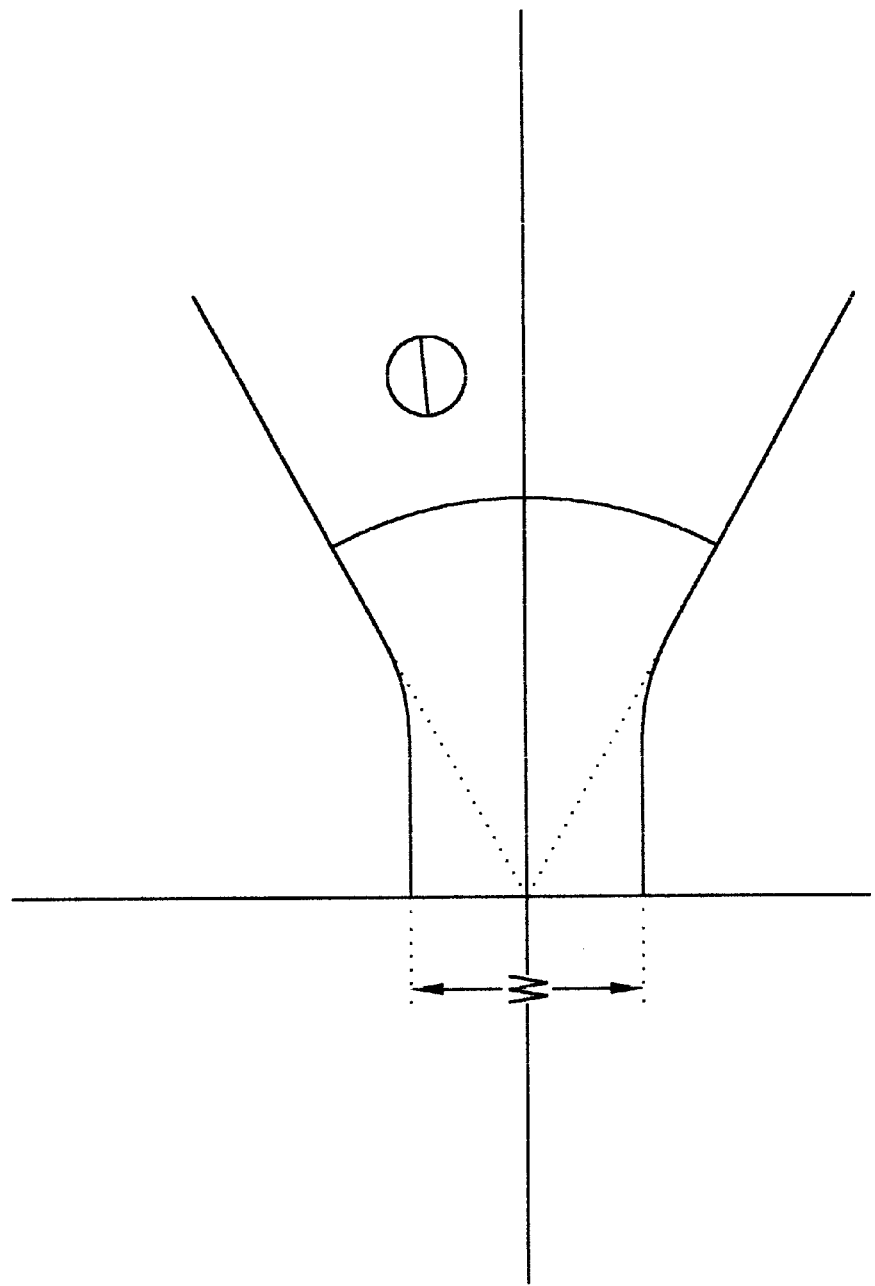
FIG. 1 illustrates the variables employed in beam quality determinations.
Figure 2:
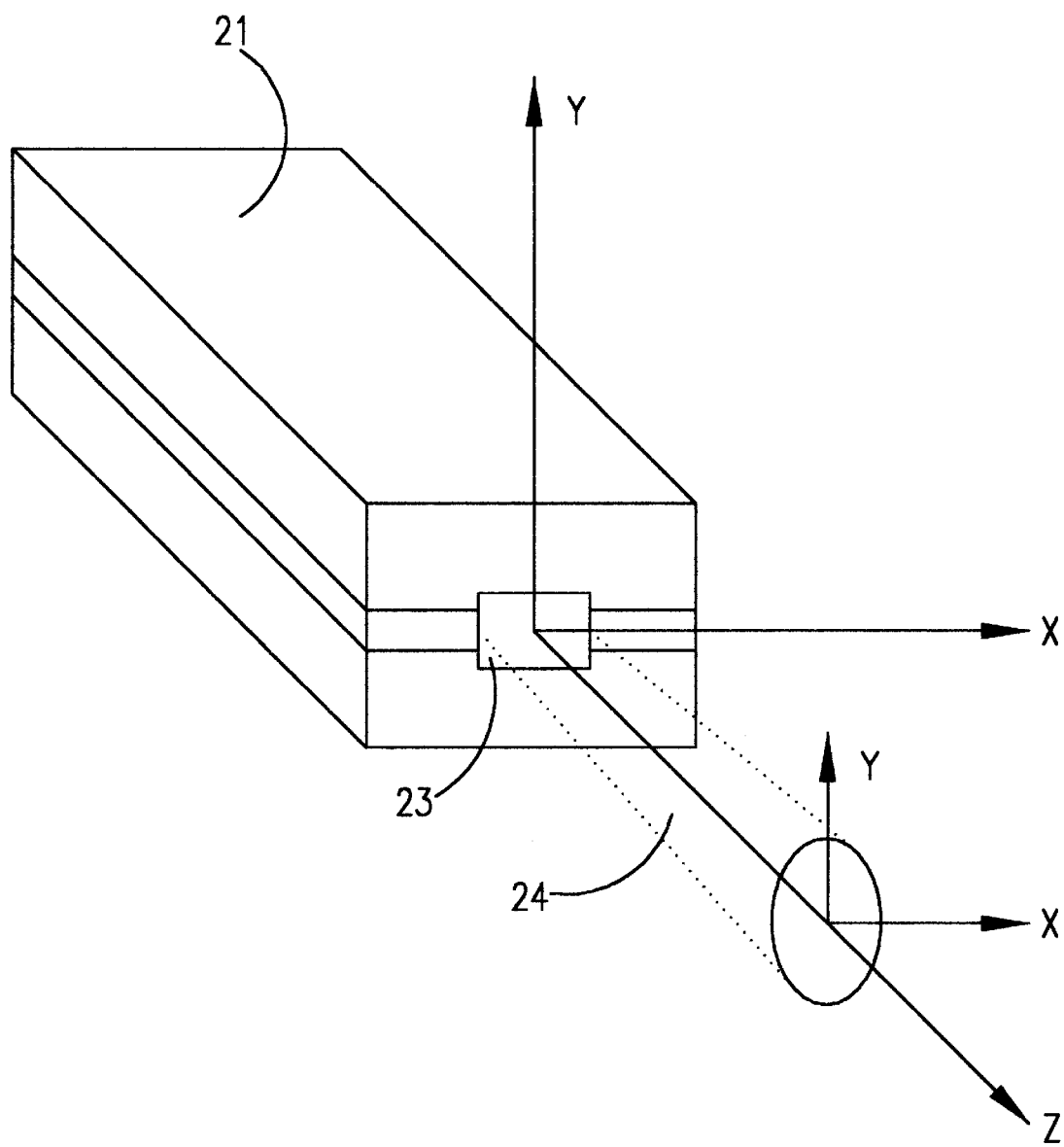
FIG. 2 displays the output laser beam of a typical semiconductor laser diode.
Figure 3:
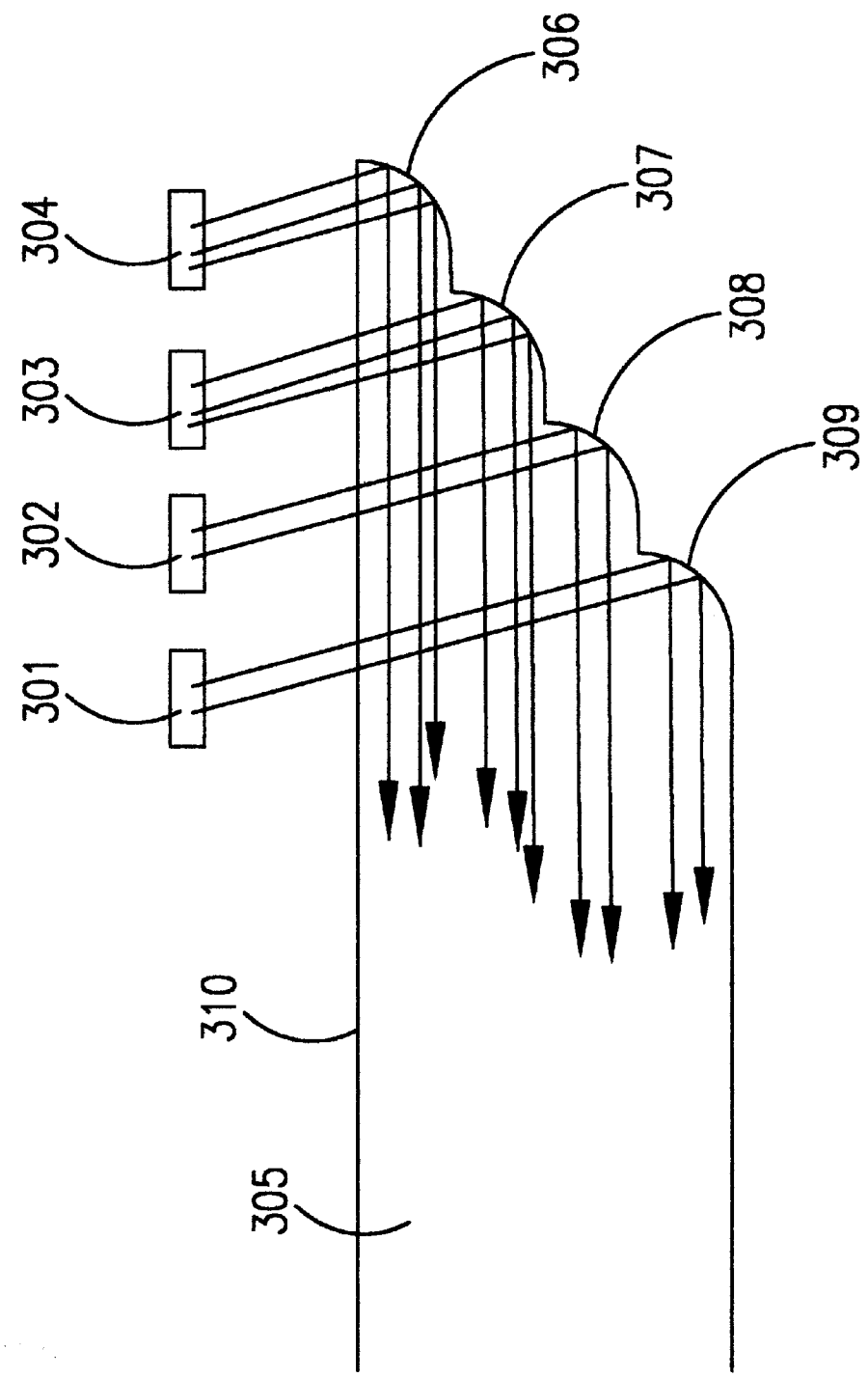
FIG. 3 displays a state of the art laser beam combiner.
Figure 4A:
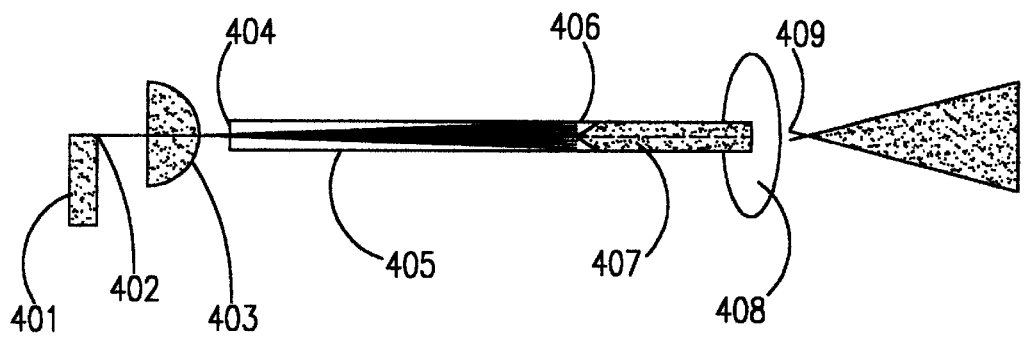
FIG. 4a and 4b illustrate an embodiment of the present invention in two views (normal to each other).
Figure 4B:
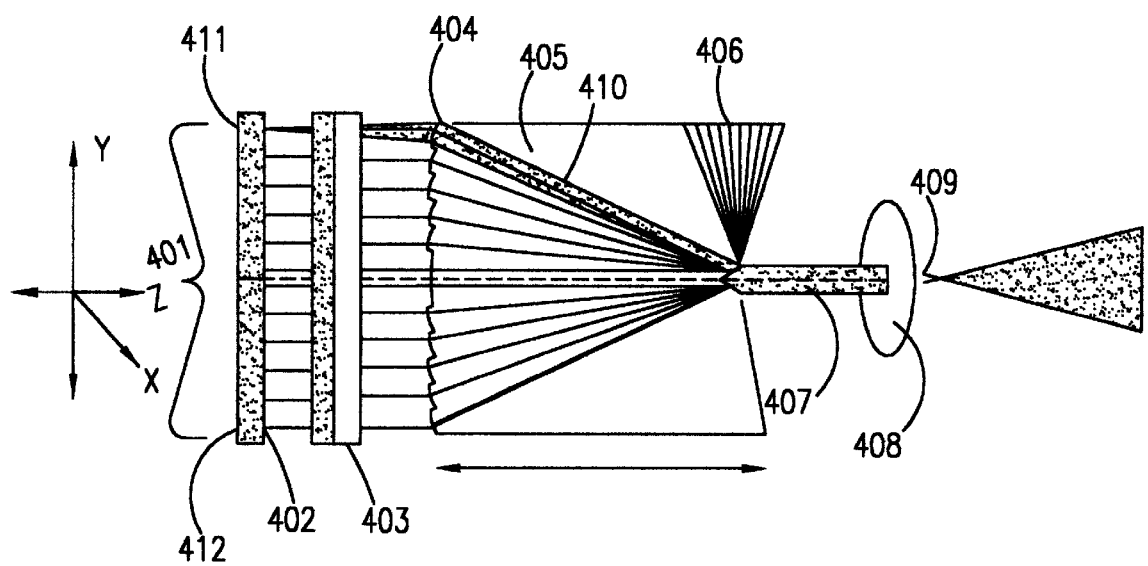

FIG. 4a and 4b show an embodiment of the present invention in two orientations (normal to each other). FIG. 4a is shown in the primary y-z plane, where the primary y-axis is hereinafter perpendicular to the p-n plane of diode laser emitters 402, the primary z-axis is hereinafter the axis that radiation from diode laser emitters 402 propagates along, the primary x-axis is hereinafter parallel to the p-n plane of diode laser emitters 402, and the origin is the center of the diode laser subsystem. FIG. 4b is displayed looking straight down the primary y-z plane, perpendicular to the primary x-z plane, which is defined by the primary x-axis and primary z-axis.

Radiation from diode laser emitters 402 of diode laser array 401 that is propagating along the primary z-axis is collimated in the fast axis (e.g. along the primary y-axis) by cylindrical microlens 403. Due to its large angle of divergence, it is advantageous to collimate the fast axis as soon as possible, and the distance between 402 and 403 might be as small as 50 μm.

Furthermore, microlens 403 is slightly tilted in the primary x-y plane, relative to diode laser array 401 so that the top of cylindrical microlens 403, has positive y-coordinate and negative x-coordinate values (the origin is the center of diode laser array 401), and the bottom of cylindrical microlens 403 has negative y-coordinate values and positive x-coordinate values (i.e. the top of microlens 403 is pushed into the plane of the paper, and the bottom is projecting out of this plane). Microlens 403 is tilted to shift the optical axes of the radiation from diode laser emitters 402. Each individual beam entering microlens 403 have equivalent primary x and z coordinates. Microlens 403 shifts the optical axes along the primary x-axis so that the beams enter lens array 404 only with equivalent primary z values. The primary x-axis distance at lens array 404 between first diode laser emitter 411 beam and last diode laser emitter 412 beam correlates to eventual combined beam 407 height.

In a preferred embodiment, the slow axis (e.g. the x-axis) can be collimated by lens array 404, but it is not necessary. Lens array 404 tilts the optical axes of the individual beams from diode laser emitters 402 towards the corresponding step of fan window 406. In a preferred embodiment, each diode laser emitter 402 corresponds to a step of lens array 404, but it is not necessary. The size and number of steps of both lens array 404 and fan window 406 may be varied to achieve a required spot size and shape.

Figure 5:
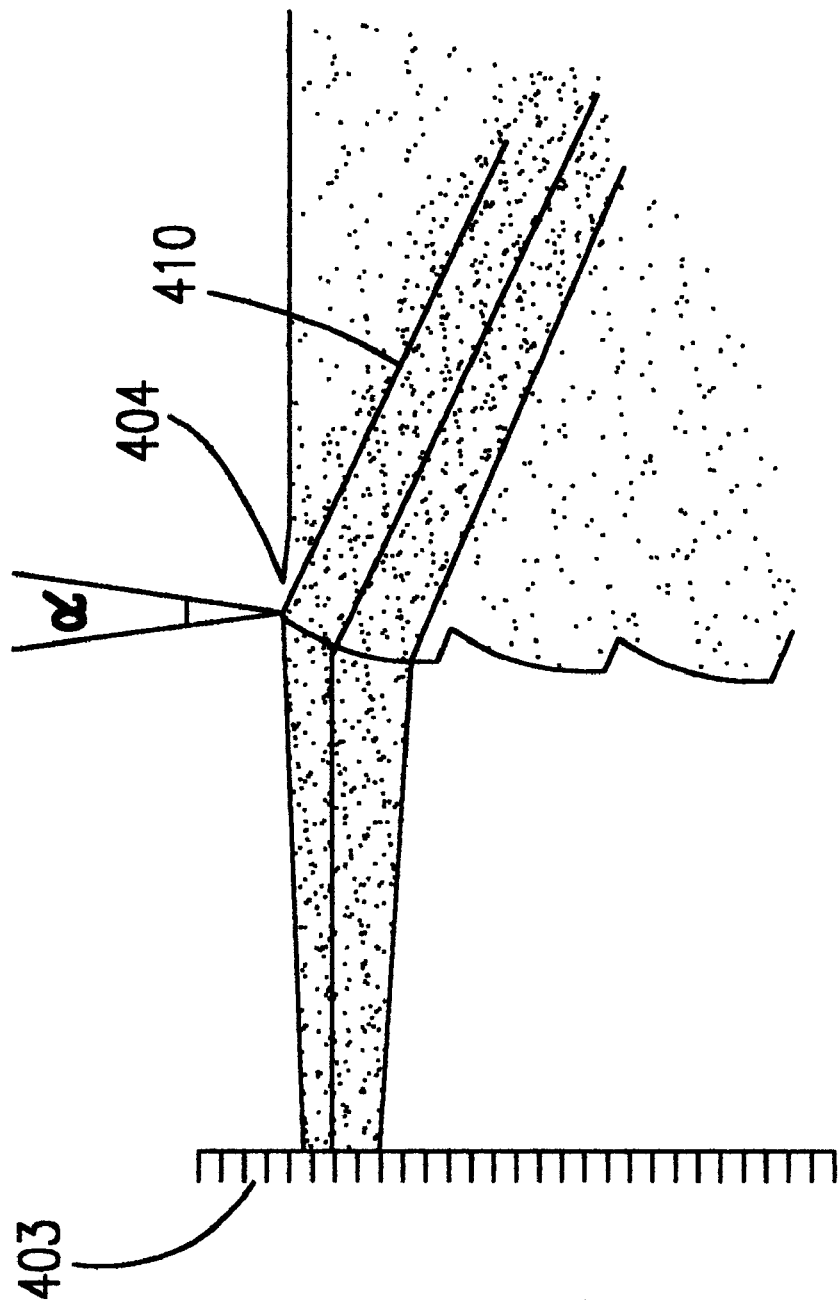

The tilting of an optical axis is further shown in FIG. 5, which displays a magnified portion of FIG. 4a enclosed in the circle referenced by C. Radiation exiting cylindrical microlens 403 enters lens array 404 which has a surface that is normal to the angle a so that the individual beam converges toward the corresponding step of fan window 406.

FIG. 4a also illustrates that between lens array 404 and fan window 406, each individual beam propagates to the same coordinate along the primary z-axis, and the beams converge towards the primary x-z plane. The beams propagate along the primary z-axis so that at fan window 406, the difference between the primary x-coordinates of first diode laser emitter 411 beam and last diode laser emitter 412 beam is equal to the distance between the two beams at lens array 404. In other words, although the beams appear to converge to a single point at fan window 406, the beams still have different primary x-coordinates, although the primary y and z coordinates are equivalent for all the beams at fan window 406.

Each step of fan-window 406 may correspond to a single beam and has an angle relative to the primary optical axis (e.g. the primary z-axis) so that the incoming beams are combined into combined beam 407 along this primary axis. Fan window 406 can be described as a stepped surface that is rotated around a central axis being normal to the primary optical axis, and the primary x-z plane. The steps diverge outward from the midpoint of fan window 406. Fan window 406 neither increases nor decreases in thickness while transgressing towards the midpoint. Fan window 406 combines the incoming beams in two dimensions along the primary optical axis.

Figure 6:
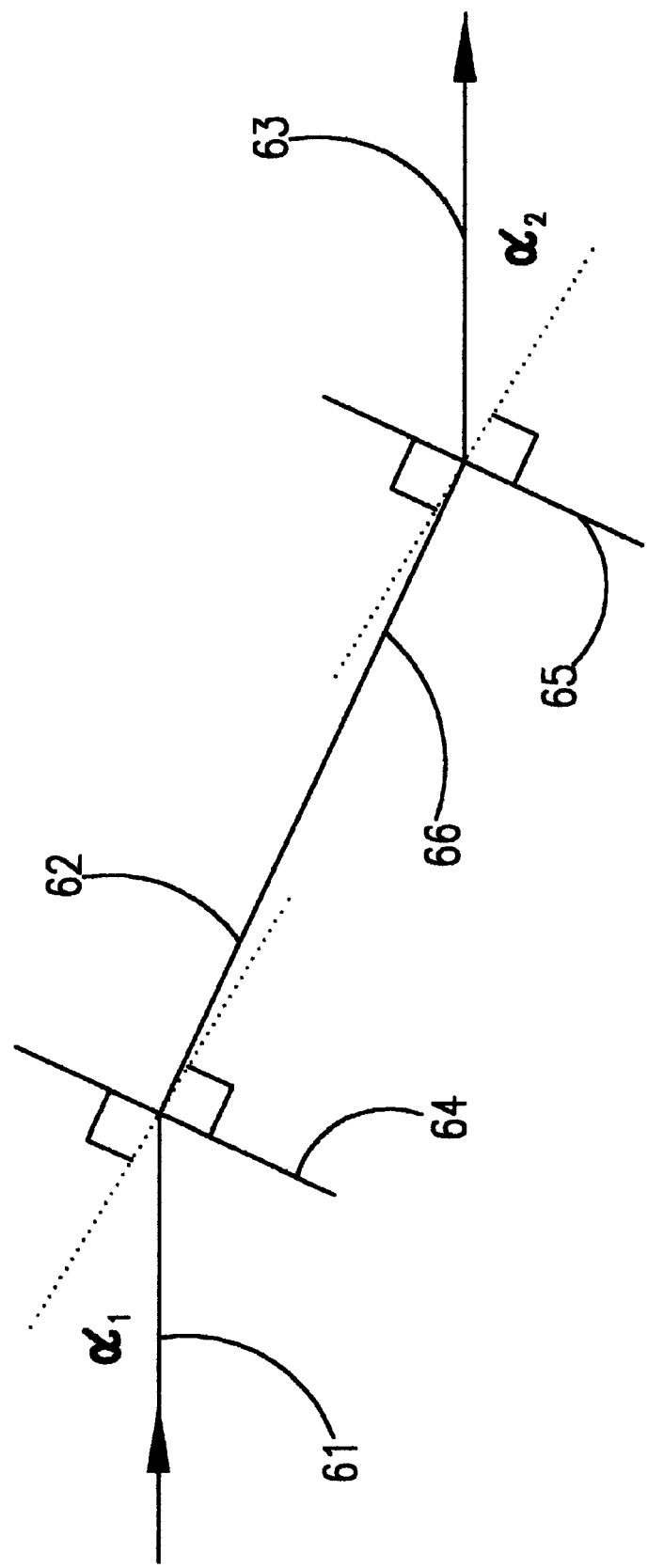
FIG. 6 displays the geometrical relationships of a laser beam within the present invention.

FIG. 6 illustrates that the angle of fan window step 65 of fan window 406 in FIG. 4a depends directly on the incident angle of incoming radiation to lens array surface 64 of lens array 404 in FIG. 4a. Incident beam 61 has an angle of incidence equal to $\alpha_1$. Incident beam strikes lens array surface 64 and is refracted towards the midpoint of fan window step 65. Refracted beam 62 propagates along the primary z-axis while converging towards the primary x-z plane, as described above. Refracted beam 62 is refracted by fan window step 65 at an angle of refractance also equal to $\alpha_1$ so that output beam 63 is refracted parallel to the primary z-axis, and is combined with beams from other fan window steps into a substantially rectangular shape.

Figure 7A:
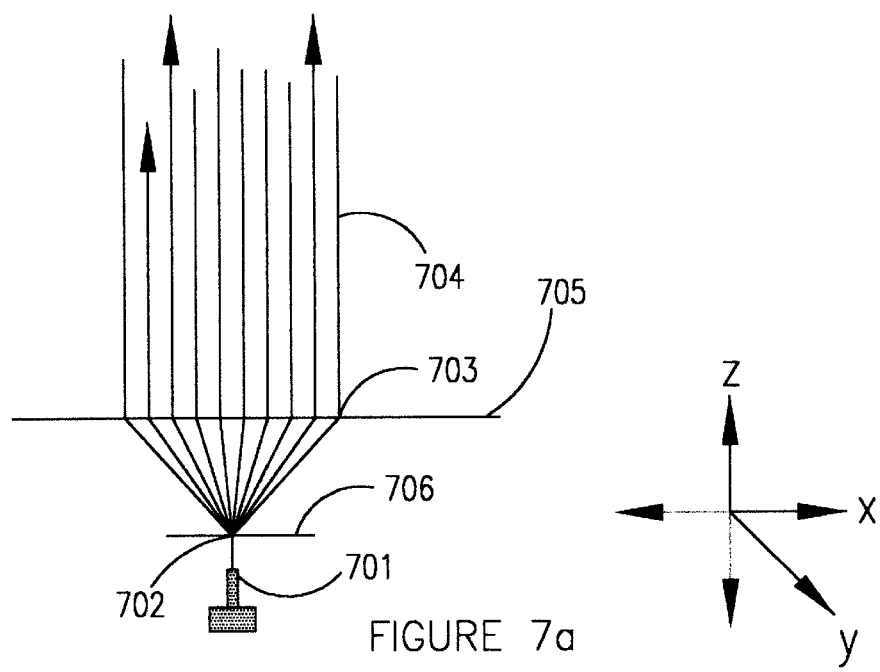
FIG. 7a–7c depict the manipulation of diode laser beams from three different perspectives.
Figure 7B:
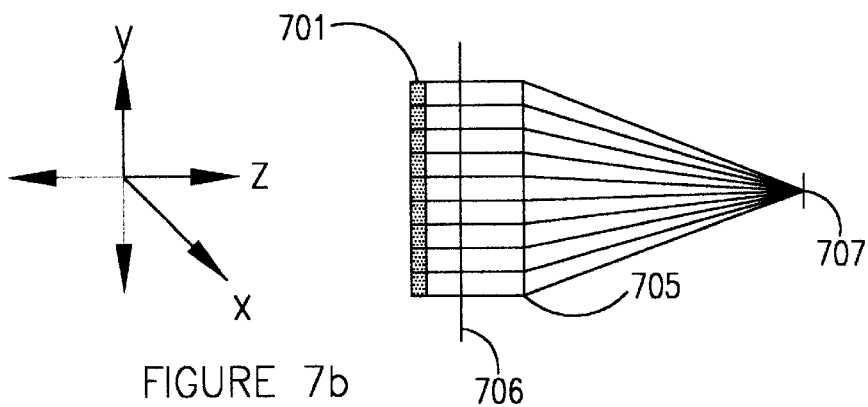
Figure 7C:
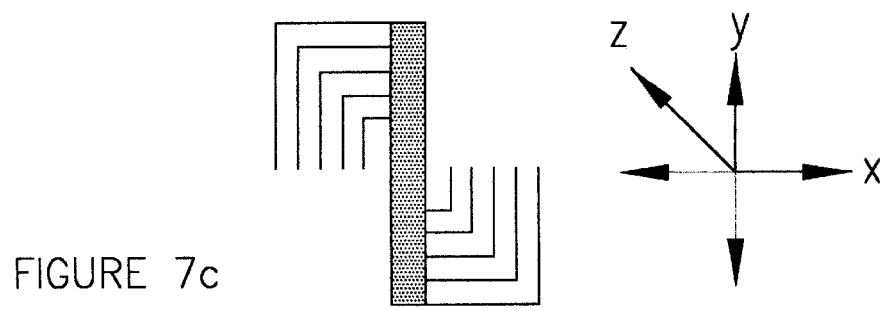

FIG. 7a–7c (not drawn to scale) summarily depicts the laser beams from three different views. In FIG. 7a the diode beam combiner system is viewed from the top, perpendicular to the primary x-z plane. Beams from diode laser emitters 402 appear as a line between the emitters 402 and cylindrical microlens 403 because the beams are stacked. Microlens 403 is slightly tilted so that the beams diverge away from the primary z-axis along the primary x-axis until they enter lens array 404. The distance that a beam diverges from the primary z-axis depends on the distance microlens 403 is tilted relative to emitters 402 at the point that the beam enters microlens 403. After entering lens array 404 the beams converge along the primary y-axis, towards the primary x-z plane.

FIG. 7b illustrates the same embodiment from a side view, perpendicular to the primary y-z plane. Beams from diode laser emitters 402 are tilted along the primary x-axis by cylindrical microlens 403. Although from this view, the beams appear to travel straight between microlens 403 and lens array 404, the beams are actually diverging away from the primary z-axis between these two points. The beams enter lens array 404 and the optical axes are tilted so that the beams converge along the primary y-axis, towards the primary x-z plane. It appears as though the beams converge to a single point at fan window 406, but the beams all have different primary x-coordinates (half of the beams have positive x coordinates and half have negative coordinates).

Lastly, FIG. 7c displays the same embodiment as FIG. 7a and 7b from a behind view, perpendicular to the primary x-y plane. Radiation from diode laser array 401 propagates toward cylindrical microlens 403 of FIG. 7b (which is covered up by diode laser array 401). The microlens tilts the optical axes of the beams along the primary x-axis. Half of the beams are tilted toward negative primary x-coordinates and half are tilted toward positive primary x-coordinates, depending on the point where the beams strike microlens 403 in FIG. 7b. The beams then propagate toward lens array 404 of FIG. 7b (also not pictured) that tilts the optical axes so that they converge along the primary y-axis, towards the primary x-z plane. In FIG. 7c, the line between diode laser array 401 and point 709 represents a beam after it has been tilted by the microlens. The beam is also traveling along the primary z-axis between these two points. At point 709 the beam enters the lens array and its optical axis is again shifted. From point 709 to point 710, the beam is converging toward the primary x-z plane, while maintaining the same primary x-coordinate value the beam had at point 709. At point 710, the beam exits the fan window step and is refracted directly into the paper. At this point, all the beams have identical primary y and z-coordinates, but different primary x-coordinates.

FIG. 4a further shows that combined beam 407 propagating along the primary z-axis is focused by lens 408 to substantially rectangular shaped spot 409. In a preferred embodiment, this combined energy (rectangular shaped spot) is coupled into an optical delivery fiber, although the system may be directly employed without the use of optical fibers. This spot shape may be advantageous because the radiation may efficiently couple into a standard round optical delivers fiber There is a better match between the phase space of an optical fiber, and the phase space of the combined laser beam. Less energy density is therefore dissipated as the combined beam propagates through the optical fiber.

Figure 8:
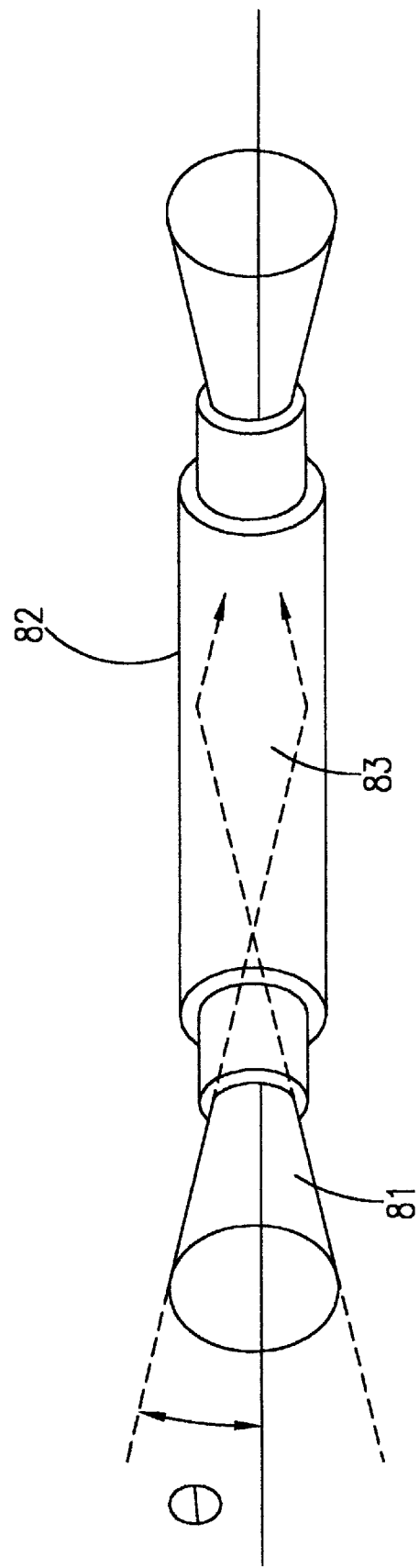
FIG. 8 displays the variables necessary for determination of numerical aperture.

Placing an optical fiber with an appropriate numerical aperture (NA) and diameter at focus spot 409 can achieve fiber coupling. FIG. 8 illustrates that radiation entering an optical fiber within the boundary of acceptance cone 81 will be propagated throughout optical fiber core 83. The NA of an optical fiber is equal to sin θ where θ is the half angle of acceptance cone 81. NA is also related to the refractive indices of optical fiber core 83 and cladding 82 by:

$$NA = (n_1^2 - n_2^2)^{1/2} \qquad (4)$$

Where $n_1$ is the refractive index of optical fiber core 83, and $n_2$ is the refractive index of optical fiber cladding 82. A high NA represents a wide acceptance angle for the laser energy to couple into the optical fiber, while a low NA requires a more collimated input beam. Generally, a high NA is required for efficient coupling into small optical fiber core cross sections, but a high NA also indicates the output from the optical fiber will be largely divergent. Therefore, an optimal NA maximizes the energy that may be coupled into an optical fiber, while still maintaining a narrow output beam. The present invention maintains the smallest spot size available from a diode laser source and thus, the smallest possible core cross sectional optical delivery fibers may be utilized.

Small core cross sectional optical fibers are required for applications such as laser welding, cutting and surface treatment, and pumping of solid state lasers and optical fiber lasers or amplifiers because small core cross sections can maximize power density and beam brightness available at the work or treatment site. Since diode laser emitters must be united to form an array to produce sufficient power for these applications, the combined beam width increases, and coupling efficiencies decrease. However, the present invention improves beam quality and allows for effective coupling of radiation into the smallest possible optical fiber core cross sections with the smallest possible NA, to transmit the greatest available power density and beam brightness.

Having described preferred embodiments of the invention with reference to the accompanying drawings, it is to be understood that the invention is not limited to these precise embodiments, and that various changes and modifications may be effected therein by one skilled in the art without departing from the scope or spirit of the invention as defined in the appended claims.

What is claimed is:

1. A diode laser beam combiner system comprising:
    a diode laser subsystem having at least two diode laser emitters, whose individual outputs are non-circular in shape and have an astigmatic numerical aperture;
    each diode laser emitter having a fast axis, being perpendicular to said diode laser emitter pn-plane, and having a slow axis, being parallel to said diode laser emitter pn-plane;
    each said diode laser emitter having an x-axis along said slow axis, a y-axis along said fast axis, and a z-axis along which light energy from each said diode laser emitter propagates;
    said subsystem having a primary x-axis, y-axis, and z axis, and a primary x-y plane, x-z plane, and y-z plane;
    a cylindrical microlens that collimates said light energy propagating along said fast axis;
    a lens array having a number of steps;
    said lens array collimating said light energy propagating along said slow axis;
    a fan window having an equivalent number of steps as said lens array;
    said fan window optically combining said light energy from said diode laser emitters into a substantially rectangular shape; and,
    a lens that focuses said combined light energy to a substantially rectangular shaped spot.

2. A diode laser beam combiner system according to claim 1 wherein said diode laser subsystem comprises at least one group of simultaneously powered diode laser emitters, having at least two diode laser emitters whose output is non-circular in shape and has an astigmatic numerical aperture.

3. A diode laser beam combiner system according to claim 1 wherein said primary x-axis is parallel to said pn-plane of said diode laser emitters;
    said primary y-axis is perpendicular to said pn-plane of said diode laser emitters;
    said primary z-axis is perpendicular to said primary x-y plane; and
    said primary axes converge to a point of origin centered midway on said diode laser subsystem.

4. A diode laser beam combiner system according to claim 2 wherein said primary x-axis is parallel to said pn-plane of said diode laser emitter group;
    said primary y-axis is perpendicular to said pn-plane of said diode laser emitter group;
    said primary z-axis is perpendicular to said primary x-y plane; and
    said primary axes converge to a point of origin centered midway on said diode laser subsystem.

5. A diode laser beam combiner system according to claim 3 wherein said microlens is tilted in said primary x-y plane relative to said diode laser emitters so that said laser energy from said diode laser emitters diverges away from said primary z-axis, along said primary x-axis while maintaining said primary y-axis values.

6. A diode laser beam combiner system according to claim 3 wherein said lens array has an angle α so that said light energy converges toward said primary x-z plane.

7. A diode laser beam combiner system according to claim 4 wherein said microlens is tilted in said primary x-y plane relative to said diode laser emitter group so that said laser energy from said diode laser emitter group diverges away from said primary z-axis, along said primary x-axis while maintaining said primary y-axis values.

8. A diode laser beam combiner system according to claim 4 wherein said lens array has an angle a so that said light energy converges toward said primary x-z plane, while maintaining primary x-axis values.

9. A diode laser beam combiner system according to claim 1 wherein each step of said fan window corresponds to a single step of said lens array.

10. A diode laser beam combiner system according to claim 2 wherein each step of said fan window corresponds to a single step of said lens array.

11. A diode laser beam combiner system according to claim 1 wherein said fan window steps are parallel to corresponding said lens array steps so that said light energy is combined into said substantially rectangular shaped spot.

12. A diode laser beam combiner system according to claim 2 wherein said fan window steps are parallel to corresponding said lens array steps so that said light energy is combined into said substantially rectangular shaped spot.

13. A diode laser beam combiner system according to claim 1 wherein "enveloped" beam quality from said diode laser subsystem is improved by limiting effects due to space between said individual diode laser emitters of said diode laser subsystem.

14. A diode laser beam combiner system according to claim 2 wherein "enveloped" beam quality from said diode laser subsystem is improved by limiting effects due to space between said individual diode laser emitters of said diode laser subsystem.

15. A diode laser beam combiner system according to claim 1 that provides maximum power density and beam brightness available from said diode laser emitters to a work or treatment site.

16. A diode laser beam combiner system according to claim 2 that provides maximum power density and beam brightness available from said diode laser group to a work or treatment site.

* * * * *